(12) United States Patent
Jan

(10) Patent No.: US 11,543,458 B2
(45) Date of Patent: Jan. 3, 2023

(54) POWER UNIT INCLUDING MULTIPLE BATTERY PACKS FOR USE WITH OUTDOOR POWER EQUIPMENT

(71) Applicant: Briggs & Stratton, LLC, Wauwatosa, WI (US)

(72) Inventor: Numan Mohammad Jan, Wauwatosa, WI (US)

(73) Assignee: Briggs & Stratton, LLC, Wauwatosa, WI (US)

( * ) Notice: Subject to any disclaimer, the term of this patent is extended or adjusted under 35 U.S.C. 154(b) by 10 days.

(21) Appl. No.: 16/850,988

(22) Filed: Apr. 16, 2020

(65) Prior Publication Data

US 2020/0333402 A1   Oct. 22, 2020

Related U.S. Application Data

(60) Provisional application No. 62/835,693, filed on Apr. 18, 2019.

(51) Int. Cl.

| | |
|---|---|
| *G01R 31/3835* | (2019.01) |
| *H01M 10/48* | (2006.01) |
| *H01M 10/42* | (2006.01) |
| *H01M 10/44* | (2006.01) |
| *G01R 31/36* | (2020.01) |
| *H01M 50/20* | (2021.01) |

(52) U.S. Cl.
CPC ..... *G01R 31/3835* (2019.01); *G01R 31/3648* (2013.01); *H01M 10/425* (2013.01); *H01M 10/441* (2013.01); *H01M 10/482* (2013.01); *H01M 50/20* (2021.01)

(58) Field of Classification Search
CPC ........... G01R 31/3835; G01R 31/3648; H01M 50/20; H01M 10/482; H01M 10/425; H01M 10/441; H01M 2010/4271; H01M 2220/30; H02J 7/0018; H02J 7/34; H02J 7/0048; Y02E 60/10
USPC ......................................................... 320/112
See application file for complete search history.

(56) References Cited

U.S. PATENT DOCUMENTS 9,257,865 B2 *  2/2016  Huggins ................. H02J 50/40
9,472,979 B2 * 10/2016  Mergener .............. H02J 7/0063
(Continued)

FOREIGN PATENT DOCUMENTS

| CA | 2523240 C | * 12/2009 | .......... B60L 11/1874 |
| JP | 2004364419 A | * 12/2004 | .............. Y02E 60/10 |

*Primary Examiner* — M Baye Diao
(74) *Attorney, Agent, or Firm* — Foley & Lardner LLP

(57) ABSTRACT

A power unit operable to power equipment, the power unit including an electric motor, multiple removable and rechargeable battery packs, multiple switching elements, and a control unit. Each of the switching elements is connected between one of the battery packs and the electric motor and operate in one of an open position or a closed position. The control unit is operable to manage the position of the switching elements. The control unit is configured to determine whether one or more battery packs are supplying power for the electric motor, measure a voltage of each of the battery packs, determine whether each of the voltage measurements is within a predetermined value to each other, calculate a pulse width modulated (PWM) signal for each of the switching elements, assign each PWM signal to one of the switching elements, and apply each of the PWM signals to the assigned switching element.

18 Claims, 4 Drawing Sheets

(56) References Cited

U.S. PATENT DOCUMENTS

| | | | |
|---|---|---|---|
| 9,583,793 B2 * | 2/2017 | White | H01M 50/209 |
| 9,673,738 B2 * | 6/2017 | Miller | H02P 4/00 |
| 10,236,819 B2 * | 3/2019 | White | H01M 50/20 |
| 10,804,575 B2 * | 10/2020 | Machida | B60L 53/62 |
| 10,894,484 B2 * | 1/2021 | Han | B60L 53/66 |
| 11,069,924 B2 * | 7/2021 | Lee | H02J 7/007184 |
| 2016/0204475 A1 * | 7/2016 | White | H02J 7/0029 429/97 |
| 2019/0160972 A1 * | 5/2019 | Zeiler | H02J 7/0063 |
| 2019/0388923 A1 | 12/2019 | Giacalone et al. | |

* cited by examiner

POWER UNIT INCLUDING MULTIPLE BATTERY PACKS FOR USE WITH OUTDOOR POWER EQUIPMENT

CROSS-REFERENCE TO RELATED PATENT APPLICATIONS

This application claims the benefit of and priority to U.S. Provisional Patent Application No. 62/835,693, filed Apr. 18, 2019, which is incorporated herein by reference in its entirety.

FIELD

The present disclosure generally relates to a power unit including multiple battery packs for use with outdoor power equipment. More specifically, the present disclosure relates to a power unit that allows multiple battery packs to be connected in parallel with each other and connected to power equipment to operate the power equipment The present disclosure is contemplated for use with riding vehicles, including but not limited to all-terrain vehicles (ATVs), riding lawn tractors, zero turn mowers, stand-on mowers, utility vehicles, crossover utility vehicles (example: Gator™), high-performance utility vehicles, forklifts, spreaders and others. Additionally, the present disclosure relates to a power unit that allows multiple combinations of battery packs to be used in high power outdoor power equipment, such as snow throwers, turf care equipment (aerators, sod cutter, dethatchers), debris vacuums, pressure washers, blowers, tillers, edgers, construction equipment (concrete saws, compactors, vibrating plates), riding mowers, zero turn mowers.

BACKGROUND

Connecting multiple battery packs together can increase the capacity of the battery power supply system. For example, connecting multiple battery packs in parallel generally increases the capacity (amp-hours) of the battery power supply system while the combined output retains the voltage level of the individual battery packs. However, if the voltages of the battery packs, when connected in parallel, are not approximately equal, charging and discharging issues can arise.

One such issue for parallel-connected battery packs is referred to as cross charging. Cross charging can occur when one of the battery packs is at a higher voltage, or state of charge, than the state of charge of other parallel-connected battery packs. When this occurs, current from the battery pack at the highest state of charge will begin to charge the battery packs at lower voltages. This may reduce the cycle life of the battery packs or damage the battery packs during the undesired charging and discharging.

The present disclosure attempts to address this problem by providing a power unit that includes a control unit and switchable elements to control the discharging sequencing of the individual battery packs.

SUMMARY

One embodiment of the present disclosure is a power unit operable to power equipment. The power unit includes an electric motor, multiple battery packs, multiple switching elements, and a control unit. Each of the multiple battery packs is removable and rechargeable. Each of the switching elements is connected between one of the battery packs and the electric motor. Each of the switching elements is controllable to operate in a position that is one of an open position or a closed position to allow current flow to and from the battery pack to the electric motor. The control unit is operable to manage the position of each of the multiple switching elements. The control unit is configured to determine whether one or more battery packs are supplying power for the electric motor, in response to determining more than one battery pack is supplying power, measure a voltage of each of the battery packs, determine whether each of the voltage measurements is within a predetermined value to each other, calculate a pulse width modulated signal for each of the switching elements, assign each pulse width modulated signal to one of the switching elements, and apply each of the pulse width modulated signals to the assigned switching element.

Another embodiment of the present disclosure is a method for selectively controlling discharge of multiple battery packs to power equipment. The method includes determining, by a control unit, whether one or more battery packs are supplying power for the equipment. The equipment includes an electric motor. The method includes, in response to determining more than one battery pack is supplying power, measuring, by the control unit, a voltage of each of the battery packs. The method includes determining, by the control unit, whether each of the voltage measurements is within a predetermined value to each other. The method includes calculating, by the control unit, a pulse width modulated signal for each of multiple switching elements, each pulse width modulated signal assigned to one of the switching elements. The method includes applying, by the control unit, each of the pulse width modulated signals to one of the switching elements. Each of the switching elements is connected between one of the battery packs and the electric motor and is configured to operate in one of an open position or a closed position to allow current flow to and from the connected battery pack to the electric motor.

Another embodiment of the present disclosure is an apparatus. The apparatus includes an electrical load, multiple battery packs, multiple switching elements, and a control unit. Each of the multiple battery packs is removable and rechargeable. Each of the switching elements is connected between one of the battery packs and the electrical load. Each of the switching elements is controllable to operate in a position that is one of an open position or a closed position to allow current flow to and from the battery pack to the electrical load. The control unit is operable to manage the position of each of the multiple switching elements. The control unit is configured to determine whether one or more battery packs are supplying power for the electrical load, in response to determining more than one battery pack is supplying power, measure a voltage of each of the battery packs, determine whether each of the voltage measurements is within a predetermined value to each other, calculate a pulse width modulated signal for each of the switching elements, assign each pulse width modulated signal to one of the switching elements, and apply each of the pulse width modulated signals to the assigned switching element.

The present disclosure relates to a power unit that is operable to power an electrical load, such as the electric motor(s) of outdoor power equipment. The power unit includes a number of removable and rechargeable battery packs. Each of the removable and rechargeable battery packs includes a number of battery cells joined together to generate a current and voltage output.

The power unit includes multiple switching elements that each can transition between an open position and a closed position to selectively provide power from the battery packs to the electrical load (e.g., a motor). A battery management system is programmed to automatically manage the state of the switching elements to control the current draw from the number of battery packs to power the electrical load. The battery management system can include a control unit that controls the state of the switching elements during discharging of the battery packs.

In one embodiment, the switching element can include a transistor where the control unit separately controls the state of the transistor to control discharging of the battery pack associated with the switching elements. The transistor allows the battery pack to be charged and discharged at a rapid rate using pulse width modulation. In another embodiment, the switching element can be a diode or a switching relay.

The power unit of the present disclosure can be used to power a wide variety of electrical loads, including drive motors of outdoor power equipment, such as walk behind mowers, pressure washers, string trimmers, etc.

Various other features, objects, and advantages of the invention will be made apparent from the following description taken together with the drawings.

BRIEF DESCRIPTION OF THE DRAWINGS

The drawings illustrate the best mode presently contemplated of carrying out the disclosure. In the drawings.

DETAILED DESCRIPTION

Figure 1:
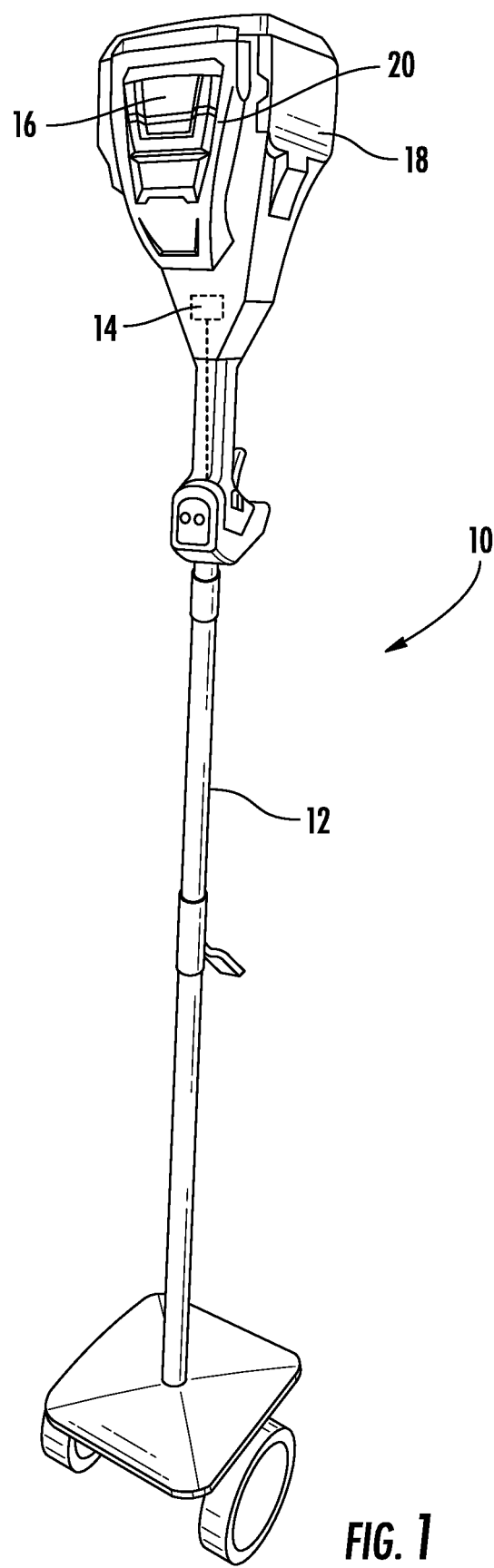
FIG. 1 is a perspective view of a piece of outdoor power equipment, according to an exemplary embodiment.

FIG. 1 illustrates a handheld battery powered piece of outdoor power equipment 10. FIG. 1 illustrates only one embodiment of the possible type of outdoor power equipment that can be battery powered. In the embodiment shown in FIG. 1, the outdoor power equipment 10 is a handheld edger 12, although other equipment is contemplated. The edger 12 includes an electric motor 14 and two or more battery packs 16 that power the electric motor 14. An electric power head 18 serves as the replacement for a small internal combustion engine of the type frequently used on a wide variety of portable power equipment. In one exemplary embodiment, the electric motor 14 is an 800-watt electric motor and each of the two battery pack is an 82-volt, 2-4 amp-hour battery. Other power levels, voltages and battery capabilities are contemplated as being within the scope of the present disclosure. As an example, the battery voltage could range from 12-volts to voltages greater than 82-volts; the battery capacity could be more or less than 2-4 amp-hours and the motor power could be more or less than 800 watts.

The powerhead 18 includes a battery receptacle 20 that is designed to securely hold two or more battery packs 16 in the position shown. Each battery pack 16 is electrically connected to the motor 14 through the battery receptacle 20 to provide power to the electric motor 14. The battery packs 16 include specifically designed latches and contacts such that the battery packs can be securely retained within the battery receptacle 20 while providing the required electrical connections to the battery cells contained within the battery pack.

Figure 2:
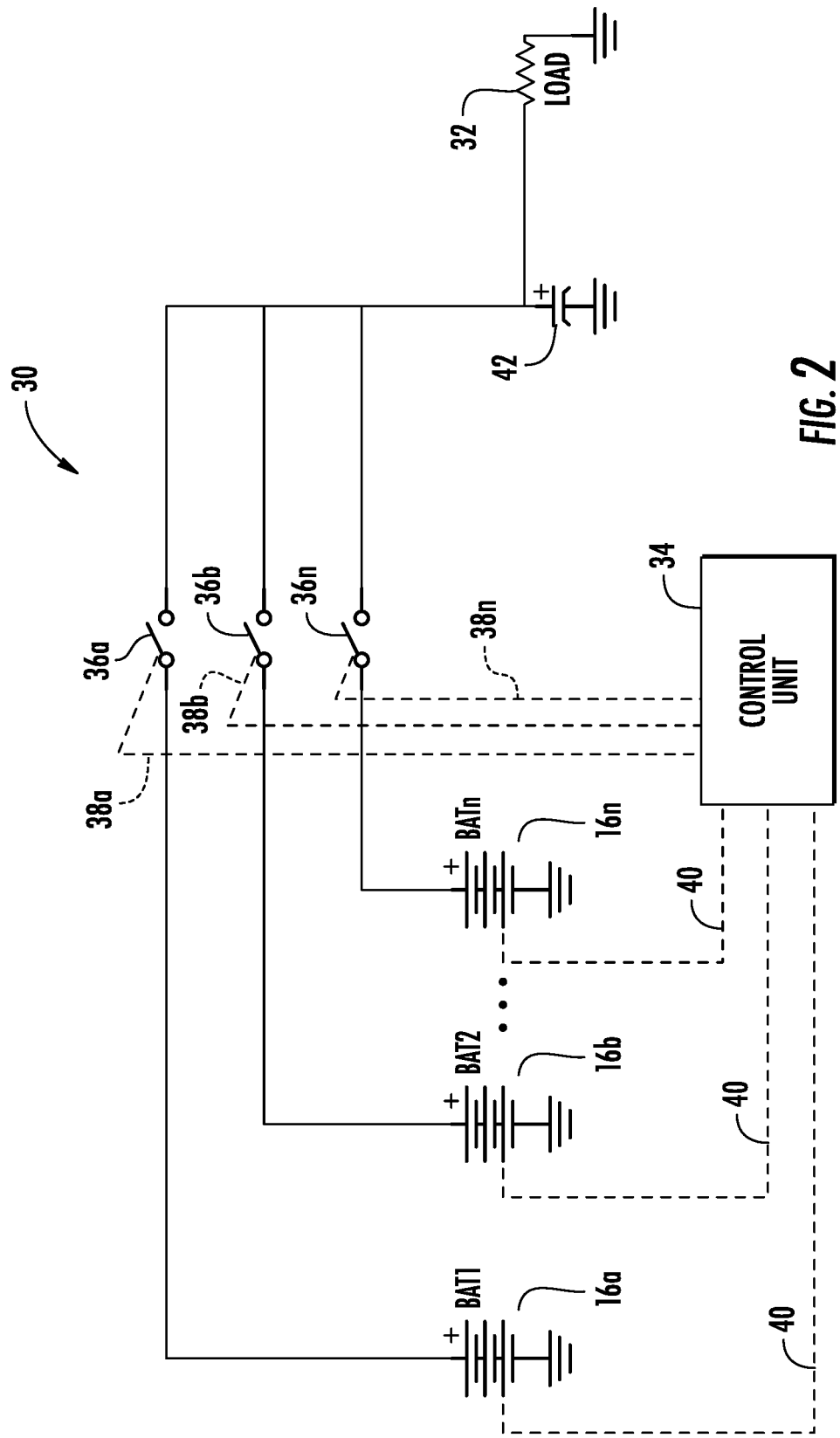
FIG. 2 is a schematic illustration of a power unit of the outdoor power equipment of FIG. 1 including multiple battery packs and switching elements.

FIG. 2 is a schematic illustration of the power unit 30 that includes a plurality of battery packs 16 that could be used to power a wide variety of end products. These end products may include outdoor power equipment, portable jobsite equipment, standby or portable power supplies, recreational or sporting equipment, and vehicles. Outdoor power equipment includes lawn mowers, riding tractors, snow throwers, pressure washers, tillers, log splitters, zero-turn radius mowers, walk-behind mowers, riding mowers, stand-on mowers, pavement surface preparation devices, industrial vehicles such as forklifts, utility vehicles, commercial turf equipment such as blowers, vacuums, debris loaders, overseeders, power rakes, aerators, sod cutters, brush mowers, sprayers, spreaders, etc. Outdoor power equipment may, for example, use an electric motor to drive an implement, such as a rotary blade of a lawn mower, a pump of a pressure washer, the auger a snow thrower, and/or a drivetrain of the outdoor power equipment. Portable jobsite equipment includes portable light towers, mobile industrial heaters, and portable light stands. Standby or portable power supplies include standby generators, portable generators, and stand-alone power supplies such as a backpack power supply for powering handhold power tools (e.g., leaf blowers, string trimmers, etc.). Recreational or sporting equipment includes ice augers, trolling motors, fish finders, boat anchor winches, bilge pumps, and fish well aerators. Vehicles include automobiles, trucks, motorcycles and other over-the road vehicles, boats such as fishing and recreational boats, snowmobiles, golf carts, and recreational off-highway vehicles such as all-terrain vehicles and utility task vehicles.

For outdoor power equipment, the power unit 30 allows the end user to manage the run time, load capability, or other operating characteristics of the outdoor power equipment by equipping the power unit 30 with a plurality of battery packs 16. The power unit 30 is able to selectively connect each of the battery backs 16 to the electrical load 32 to optimize the power available from the battery packs 16.

Each battery pack 16 includes a number of battery cells enclosed within an outer housing. In some embodiments, the battery cells are Lithium ion cells. The cells are arranged with groups of cells connected in series (S) and with groups of cells connected in parallel (P) (e.g., in a 20S5P configuration, a 14S6P a configuration, a 13S6P configuration, etc.). By providing groups of cells arranged in parallel with one another, the battery pack 16 is able to maintain system voltage, even when experiencing losses in capacity. If the cells were only connected in series, a break amongst the series connections would cause the system voltage provided by the battery module to drop.

FIG. 2 further illustrates the electrical connections utilized to power one or more electrical loads 32, such as a motor. In the embodiment shown in FIG. 2, a control unit 34, which could be one of many different types of microprocessors or microcontrollers, is used to control the state of three individual switching elements 36a, 36b and 36n. Since the number of battery packs 16 and the corresponding number of switching elements can vary, the reference character "n" is used to represent an unknown or variable number. In the embodiment shown, three battery packs 16 and switching elements 36 are shown. The state of each of the individual switching elements 36 is controlled by the control unit 34 through a control line 38. Although multiple control lines 38 (e.g., 38a-38n) are shown in FIG. 2, it should be understood that a single control line 38 could be utilized while operating within the scope of the present disclosure. In addition, the switching elements 36a-36n could be either a single element (metal-oxide-semiconductor field-effect transistor (MOSFET), insulated gate bipolar transistor (IGBT), a different transistor, relay, etc.) or could be a combination of two switching devices.

In one contemplated embodiment of the present disclosure, each of the switching elements 36a-36n is a high current MOSFET that can transition between an open and closed position through a control commands from the control unit 34. Although a MOSFET is described in one embodiment as a switching element 36, it should be understood that different types of switching elements could be utilized while operating within the scope of the present disclosure.

As illustrated in FIG. 2, the first switch 36a provides a connection between the battery pack 16a and ground through the load 32. The second switch 36b provides a connection between the battery pack 16b and ground through the load 32. The third switch 36n provides a connection between the battery pack 16n and ground through the load 32. Although three switches and battery packs 16 are shown, as few as two battery packs or a larger number of battery packs and switches could be used, up to the number "n". A capacitor 42 is shown connected between the switching elements 36 and ground to reduce any noise in the circuit. The control unit 34 is operable to selectively open and close each of the individual switching elements 36 as desired to control the discharging of the battery packs 16. Since the switching elements 36 are contemplated as being MOSFETS, the control unit 34 can open and close the switching elements 36 at rapid rates to selectively control the rate of discharge of the battery packs 16 to the motor.

In addition to controlling the position of the switching elements 36, the control unit 24 is also configured to monitor the state of charge on each of the battery packs 16 in a conventional manner through the sensing lines 40. One method of monitoring the state of charge on each of the battery packs 16 is to monitor the voltage of the respective battery packs utilizing a voltage sensor. In an illustrative example, the maximum state of charge of the battery packs will be 82 volts. When the output of the battery pack 16 falls to 80 volts, the battery pack 16 will be at 80% charge. However, the determination of state of charge based on battery pack voltage is dependent on battery types, battery configurations, and other parameters. Accordingly, state of charge will be determined relative to the maximum voltage of the battery pack voltage. Percent of maximum change will be used in the following discussion to illustrate the discharging control by the control unit 34. By monitoring the state of charge on each of the individual battery packs 16, the control unit 34 will be able to selectively control the discharge rate of each of the individual battery packs 16.

In the embodiment shown in FIG. 2, the control unit 34 can control the opening and closing of the three MOSFET switches in order to vary the discharge rates of each of the three individual battery packs 16. For example, the switch 36a could be closed for a greater amount of time as compared to the switch 36b in order to connect the battery pack 16a to the motor for a greater amount of time.

One example method of controlling the state of the switching elements 36 is to utilize pulse width modulation on control signals from the control unit 34 to selectively open and close the switching elements 36 at the desired rate.

It is contemplated that the control unit 24 could control the discharge of the three battery packs 16 to either maximize performance or to maximize longevity. This selection could be presented to the user through a switch or selection device on the power equipment or on another type of user interface.

Figure 3:
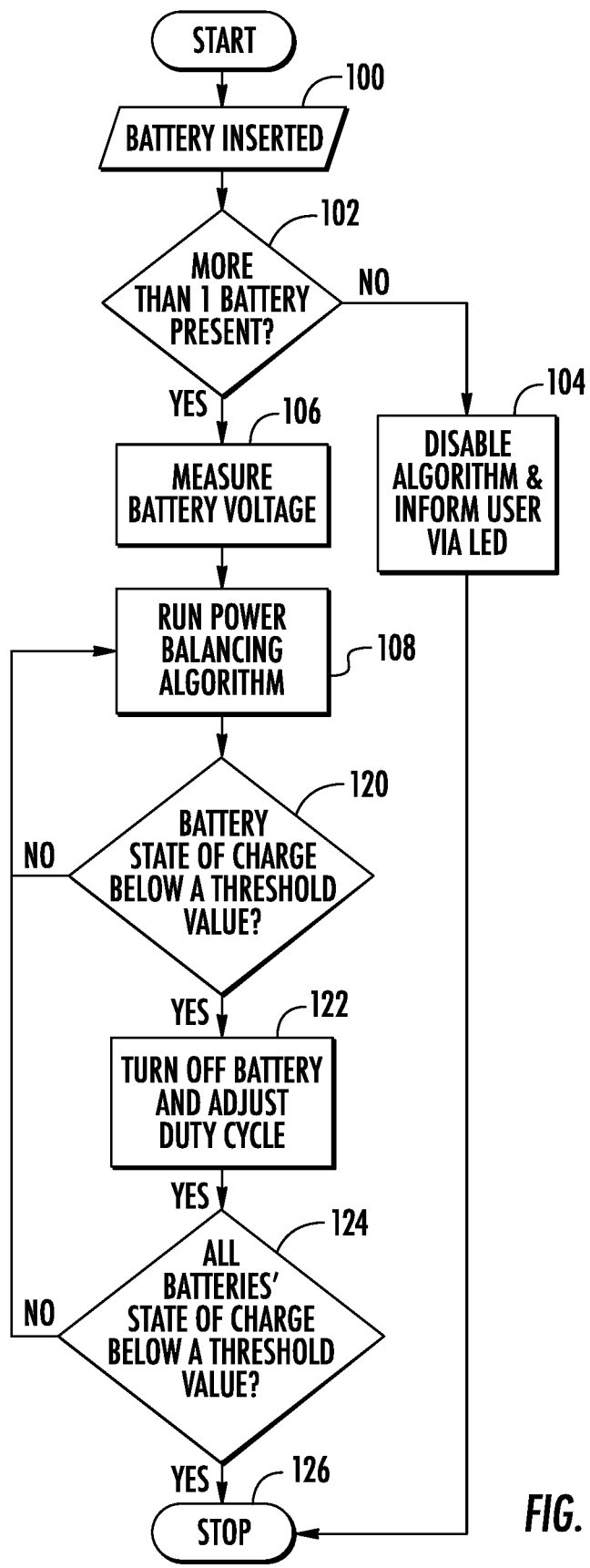
FIG. 3 is a flow chart illustrating a method of operating power equipment, according to an exemplary embodiment.

FIG. 3 illustrates one method of operating the control unit 34 to control the discharge of the plurality of battery packs 16. Although one method of operating the control unit 34 is disclosed in the embodiment of FIG. 3, it should be understood that the method illustrated in FIG. 3 is one preferred embodiment of the present disclosure.

Initially, in step 100, the control unit 34 determines whether a battery pack 16 has been inserted into the outdoor power equipment. The insertion of a battery pack 16 into the outdoor power equipment provides some type of indicator signal to the control unit 34, such as upon closing a switch or contact. Once the control unit 34 determines that a battery pack 16 has been inserted into the power equipment, the system proceeds to step 102 during which the control unit determines whether more than one battery pack 16 is present. If the system determines in step 102 that only a single battery pack 16 is present, the method disables the power balancing algorithm in step 104 and informs the user that the power balancing algorithm is not being utilized since only a single battery pack 16 is present. The power balancing algorithm of the present disclosure is used to enhance the amount of power available from multiple battery packs 16 and thus will not be used when only a single battery pack 16 is present.

Figure 4:
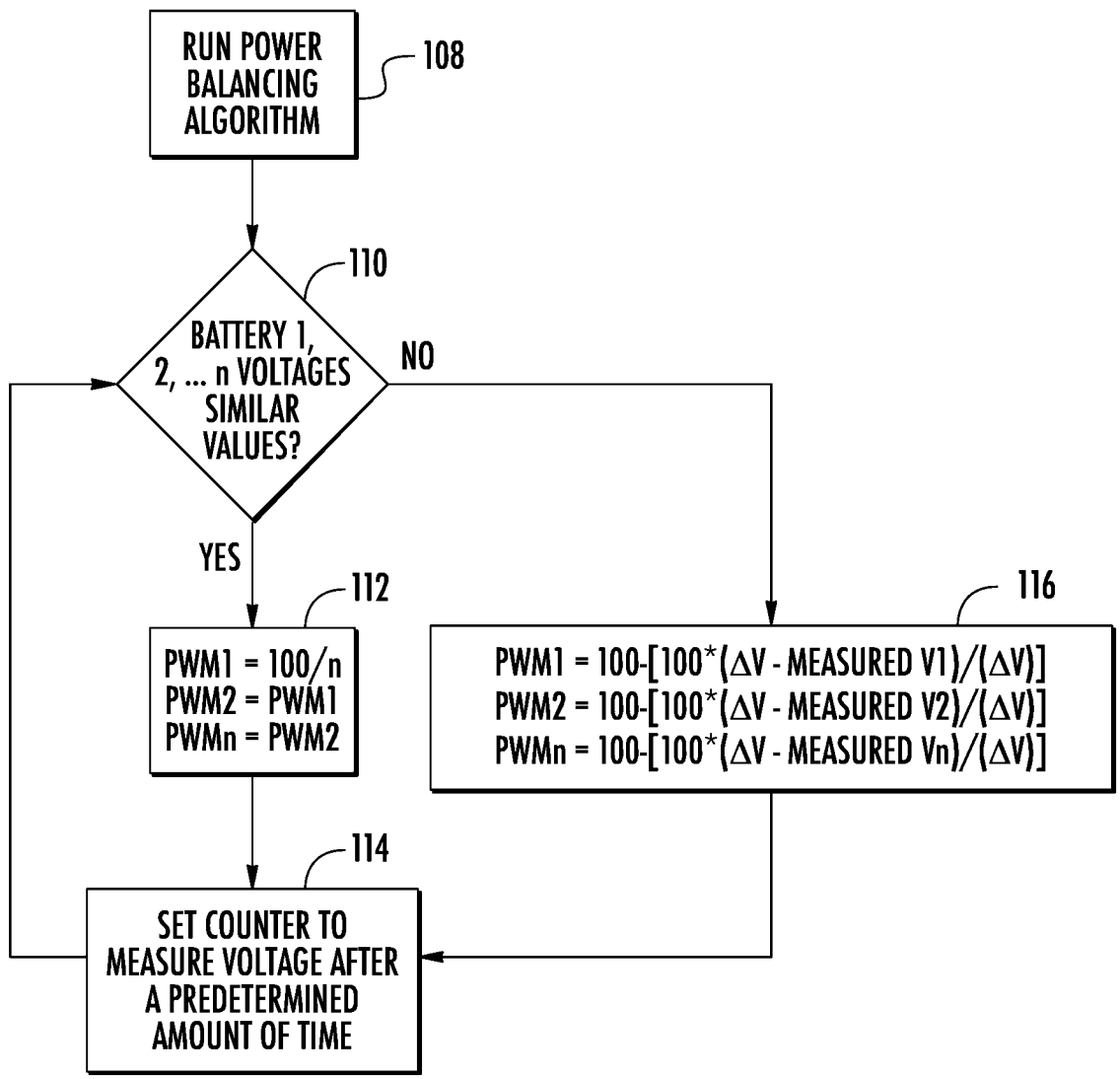
FIG. 4 is a flow chart illustrating a method of balancing power among multiple batteries, according to an exemplary embodiment.

If more than one battery pack 16 is present as indicated in step 102, the system moves to step 106, in which the control unit measures the battery voltage present at each of the battery packs 16. As indicated above, the battery voltage is measured using some type of voltage sensor and is relayed back to the control unit 34 through the series of control wires or communication lines. The battery voltage can be either an absolute value or can be expressed as a state of charge. Once the control unit 34 has determined the voltage of each of the battery packs 16, the system moves to step 108 and begins to run the power balancing algorithm. The details of the power balancing algorithm are illustrated in FIG. 4. The various measurements and PWM values are calculated based upon the number of batteries and the battery voltage on each of the battery packs 16. As shown in FIG. 4, variable n represents the number of batteries in parallel, variable V1 represents the voltage of battery 1, variable V2 represents the voltage of battery 2, variable Vn represents the voltage of battery n, variable PWM1 represents the PWM that battery 1 is subjected to, variable PWM2 represents the PWM that battery 2 is subjected to, variable PWMn represents the PWM that battery n is subjected to, and variable AV represents the value of the maximum voltage minus the minimum voltage measured of the n number of batteries in parallel.

As illustrated in FIG. 4, once the power balancing algorithm begins in step 108, the control method moves to step 110 in which the control unit determines whether the measured battery voltages on battery packs 1, 2 and up to n battery packs 16 have similar values relative to each other. The determination of the relative values of the voltages measured on each of the battery packs 16 can change depending upon the size of battery packs 16. If each of the three battery packs 16 has the same initial size, such as 82 volts, the control unit 34 determines in step 110 whether each of the battery packs 16 is at relatively the same level of charge. As an illustrative example, battery pack 16a may be at 80 volts, battery pack 16b may be at 78 volts while battery pack 16n may be at 81 volts.

Since all of the measured voltages in the example above are relatively similar to each other, the system would then move to step 112 to assign a pulse width modulated signal (PWM1, PWM2 and PWMn) that will be applied by the control unit to each of the individual switches 36a, 36b and 36n. In a situation in which all three of the battery packs 16 have relatively the same charge, the pulse width modulated signals (PWM1) applied to switch 36a would be 100/3. The remaining pulse width modulated signals applied to the other battery packs 16, up to battery pack n, would all be the same since the battery voltages measured on each battery pack 16 are essentially the same, as shown, for example, in the below equations.

$$PWM1=100/n \quad \text{(Equation 1)}$$

$$PWM2=PWM1 \quad \text{(Equation 2)}$$

$$PWMn=PWM2 \quad \text{(Equation 3)}$$

The pulse width modulated signal assigned to each of the battery packs 16 and switching elements in step 112 would then be applied to each of the switches 36 to allow all three of the battery packs 16 to discharge to power the load 32. The system then moves to step 114 in which the control unit repeatedly checks the voltage on each of the battery packs 16 again after a predetermined amount of time. For example, the control unit checks the voltage on each of the battery packs 16 every sixty seconds. The power balancing algorithm 108 continues to run in this manner as will be further described in FIG. 3.

In step 110, if the control unit determines that the battery voltages are not relative to each other, the system moves to step 116 in which the pulse width modulated signals applied to the respective switch for each battery pack 16 is determined based upon the voltage level of the battery pack 16. In each determination, the ΔV is the maximum voltage of the plurality of battery packs 16 measured minus the minimum voltage of the battery packs 16. This value is then used to determine the pulse width modulated signal (PWM1, PWM2 and PWMn) for each battery pack 16 in the manner shown in FIG. 4. The various measurements and PWM values are calculated based upon the number of batteries and the battery voltage on each of the battery packs 16, as shown in the equations below.

$$PWM1=100-[100*(\Delta V-\text{MEASURED } V1)/(\Delta V)] \quad \text{(Equation 4)}$$

$$PWM2=100-[100*(\Delta V-\text{MEASURED } V2)/(\Delta V)] \quad \text{(Equation 5)}$$

$$PWMn=100-[100*(\Delta V-\text{MEASURED } Vn)/(\Delta V)] \quad \text{(Equation 6)}$$

After step 116, the system again returns to step 114, which allows the voltage to be determined after the predetermined amount of time (e.g., sixty seconds). As can be understood by the calculations in step 116, the operating algorithm allows the battery having the greatest state of charge to be active the most until the voltage difference between all three battery packs 16 is gradually reduced.

Referring back to FIG. 3, as the power balancing algorithm is running, the system also determines in step 120 whether the battery state of charge (SOC) is below a threshold value. For example, at step 120, the system determines whether a battery has a SOC less than 25% of the battery capacity. If the battery SOC is greater than the threshold value (e.g., 25%), the system continues to run the power balancing algorithm. However, if the system determines in step 120 that the battery SOC falls below the predetermined, threshold value, or any of the battery packs' SOC fall below the threshold value, the battery pack having a SOC less than the threshold value is turned off and the duty cycles for the remaining battery packs are adjusted. In this manner, the operating algorithm will remove a battery pack 16 once the SOC falls below the predetermined, threshold value.

In step 124, the method determines whether all of the batteries have a SOC that is less than the threshold value (e.g., 25%). If the system determines that not all of the batteries' SOC are below the threshold value, the system returns to the power balancing algorithm in step 108 and continues this process until the system determines in step 124 that all of the batteries have a SOC less than the threshold value. Once this occurs, the system moves to step 126 and the batteries are indicated as being depleted.

As can be understood by the operating descriptions in FIGS. 3 and 4, the control unit is able to balance the discharge of each of the three battery packs 16 to enhance the performance of the battery packs 16. This enhanced performance allows the battery packs 16 to operate utilizing two batteries at different voltages by switching back and forth between the two batteries so that the battery pack 16 with more voltage is not charging the other battery pack 16 with less voltage. Switching the power output between the plurality of battery packs 16 will allow the battery packs 16 to power larger pieces of equipment.

Although the embodiments shown illustrate three battery packs 16 connected in parallel, it is contemplated that additional battery packs 16 could be utilized while operating within the scope of the present disclosure. Adding an additional battery pack 16 in parallel with the three battery packs 16 will both increase the run-time and will slightly increase the voltage created by the parallel-connected battery packs. The addition of battery packs 16 in parallel will also increase the available power (increased current availability), which will increase runtime. The additional battery packs 16 connected in parallel will also allow the output voltage to remain at the desired level for a longer period of time.

This written description uses examples to disclose the invention, including the best mode, and also to enable any person skilled in the art to make and use the invention. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A power unit operable to power equipment, comprising:
    an electric motor;
    a plurality of battery packs, each of the plurality of battery packs being removable and rechargeable;
    a plurality of switching elements each connected between one of the battery packs and the electric motor, each of the switching elements controllable to operate in a position that is one of an open position or a closed position to allow current flow to and from the battery pack to the electric motor; and
    a control unit operable to manage the position of each of the plurality of switching elements, the control unit configured to:
        determine whether one or more battery packs are supplying power for the electric motor;

in response to determining more than one battery pack is supplying power, measure a voltage of each of the battery packs;

determine whether each of the voltage measurements is within a predetermined value to each other;

calculate a pulse width modulated signal for each of the switching elements based on the measured voltage of each battery pack within the plurality of battery packs;

assign each pulse width modulated signal to one of the switching elements; and apply each of the pulse width modulated signals to the assigned switching element;

wherein the control unit is further configured to decouple one or more of the plurality of battery packs from the electric motor upon detecting that one or more of the plurality of battery packs have a state of charge less than a threshold value, wherein the threshold value is greater than zero percent.

2. The power unit of claim 1, wherein the control unit is further configured to, in response to determining one of the voltage measurements is not within the predetermined value to other voltage measurements, calculate the pulse width modulated signal for each of the switching elements based on the voltage measurement of the battery pack to control a discharge rate of each of the battery packs to maintain a state of charge of each of the battery packs within a predetermined range of each other.

3. The power unit of claim 1, wherein the control unit is coupled to each of the switching elements, wherein the control unit selectively opens and closes the switching elements to connect the battery packs to the electric motor to power the electric motor.

4. The power unit of claim 1, wherein each of the switching elements includes at least one of metal-oxide-semiconductor field-effect transistors (MOSFETs), insulated gate bipolar transistors (IGBTs), transistors, and relays.

5. The power unit of claim 1, wherein the control unit is further configured to, in response to determining each of the voltage measurements is relatively similar to each other, apply identical pulse width modulated signals to each of the switching elements.

6. The power unit of claim 5, wherein the identical pulse width modulated signals are calculated based on an amount of battery packs powering the equipment.

7. A method for selectively controlling discharge of a plurality of battery packs to power equipment, the method comprising:

determining, by a control unit, whether one or more battery packs are supplying power for the equipment, the equipment having an electric motor, wherein each of the one or more battery packs is removable and rechargeable;

in response to determining more than one battery pack is supplying power, measuring, by the control unit, a voltage of each of the battery packs;

determining, by the control unit, whether each of the voltage measurements is within a predetermined value to each other;

calculating, by the control unit, a pulse width modulated signal for each of a plurality of switching elements based on the measured voltage, each pulse width modulated signal assigned to one of the switching elements;

applying, by the control unit, each of the pulse width modulated signals to one of the switching elements, each of the switching elements connected between one of the battery packs and the electric motor and configured to operate in one of an open position or a closed position to allow current flow to and from the battery pack to the electric motor; and decoupling, by the control unit, one or more battery pack of the plurality of battery packs from the power equipment upon detecting that the one or more battery pack of the plurality of battery packs have a state of charge less than a threshold value, wherein the threshold value is greater than zero percent.

8. The method of claim 7, wherein the method further comprises, in response to determining each of the voltage measurements is relatively similar to each other, applying identical pulse width modulated signals to each of the switching elements.

9. The method of claim 8, wherein the identical pulse width modulated signals are calculated based on an amount of battery packs powering the equipment, wherein each of the battery packs is connected in parallel.

10. The method of claim 7, wherein the method further comprises, in response to determining one of the voltage measurements is not relatively similar to other voltage measurements, calculating the pulse width modulated signal for each of the switching elements based on the voltage measurement of the battery pack connected to the switching element.

11. The method of claim 10, wherein the pulse width modulated signal for each of the switching elements is further based on a difference between a maximum voltage measurement of one of the battery packs and a minimum voltage measurement of one of the battery packs.

12. The method of claim 7, wherein the method further comprises setting, by the control unit, a counter to measure the voltage of each of the battery packs after a predetermined amount of time.

13. The method of claim 7, wherein the method further comprises determining whether the voltage measurement of one of the plurality of battery packs is below a threshold value, wherein each voltage measurement of the battery packs is one of an absolute value or a state of charge.

14. The method of claim 13, wherein the method further comprises, in response to determining one of the voltage measurements is below the threshold value, powering off each battery pack having a voltage measurement below the threshold value.

15. The method of claim 7, wherein the method further comprises, in response to determining a single battery pack is supplying power, indicating to a user of the equipment that the single battery pack is supplying power via a light emitting diode (LED).

16. The method of claim 7, wherein the pulse width modulated signal calculated for each of the switching elements is based on whether the control unit is maximizing performance or maximizing longevity of the battery packs, wherein maximizing performance or maximizing longevity of the battery packs is selected via a user interface of the equipment.

17. An apparatus, the apparatus comprising:

an electrical load;

a plurality of battery packs, each of the plurality of battery packs being removable and rechargeable;

a plurality of switching elements each connected between one of the battery packs and the electrical load, each of the switching elements controllable to operate in a position that is one of an open position or a closed position; and a control unit operable to manage the position of each of the plurality of switching elements to control current flow from each of the plurality of battery packs to the electrical load, the control unit configured to:

determine whether one or more battery packs are supplying power for the electrical load;

in response to determining more than one battery pack is supplying power, measure a voltage of each of the battery packs;

determine whether each of the voltage measurements is within a predetermined value to each other;

calculate a pulse width modulated signal for each of the switching elements based on the measured voltage;

assign each pulse width modulated signal to one of the switching elements; and apply each of the pulse width modulated signals to the assigned switching element;

wherein the control unit is further configured to decouple one or more of the plurality of battery packs from the electrical load upon detecting that one or more of the plurality of battery packs have a state of charge less than a threshold value, wherein the threshold value is greater than zero percent.

18. The apparatus of claim 17, wherein the control unit is further configured to, in response to determining one of the voltage measurements is not within the predetermined value to other voltage measurements, calculate the pulse width modulated signal for each of the switching elements based on the voltage measurement of the battery pack connected to the switching element.

* * * * *